United States Patent [19]

Tsai

[11] Patent Number: 5,278,377
[45] Date of Patent: Jan. 11, 1994

[54] ELECTROMAGNETIC RADIATION SUSCEPTOR MATERIAL EMPLOYING FERROMAGNETIC AMORPHOUS ALLOY PARTICLES

[75] Inventor: Ching-Long Tsai, Woodbury, Minn.

[73] Assignee: Minnesota Mining and Manufacturing Company, St. Paul, Minn.

[21] Appl. No.: 800,632

[22] Filed: Nov. 27, 1991

[51] Int. Cl.$^5$ ............................................. H05B 6/64
[52] U.S. Cl. .................................... 219/759; 428/328; 428/694 R; 219/730; 75/10.1
[58] Field of Search ..................... 219/10.55E; 10.55F, 10.55M, 10.55R, 10.55D, 428/328, 428/694; 148/403, 324; 420/428, 435, 440, 459; 252/62.54, 62.55; 75/170

[56] References Cited

U.S. PATENT DOCUMENTS

| | | | |
|---|---|---|---|
| 2,830,162 | 4/1953 | Copson et al. | 219/10.41 |
| 3,620,875 | 11/1971 | Guglielmo, Sr. | 156/272 |
| 3,856,513 | 12/1974 | Chen et al. | 148/403 |
| 4,144,058 | 3/1979 | Chen et al. | 75/170 |
| 4,153,661 | 5/1979 | Ree et al. | 264/120 |
| 4,306,908 | 12/1981 | Takayama et al. | 75/170 |
| 4,371,742 | 2/1983 | Manly | 174/36 |
| 4,409,041 | 10/1983 | Datta et al. | 148/31.55 |
| 4,689,163 | 8/1987 | Yamashita et al. | 252/62.54 |
| 4,719,241 | 1/1988 | Yates | 521/28 |
| 4,814,546 | 3/1989 | Whitney et al. | 174/36 |
| 4,837,094 | 6/1989 | Kudo | 428/694 |
| 4,865,658 | 9/1989 | Kudo | 148/121 |
| 4,889,568 | 12/1989 | Datta et al. | 148/108 |
| 5,015,993 | 5/1991 | Strom-Olsen et al. | 340/551 |
| 5,032,947 | 7/1991 | Li et al. | 361/143 |
| 5,085,931 | 2/1992 | Boyer, III et al. | 428/328 |
| 5,126,521 | 6/1992 | McGaffigan | 219/10.75 |

FOREIGN PATENT DOCUMENTS

| | | | |
|---|---|---|---|
| 0239052 | 9/1987 | European Pat. Off. | H05K 9/00 |
| 0260870 | 3/1988 | European Pat. Off. | H01F 1/06 |
| 0301561 | 2/1989 | European Pat. Off. | H01F 1/12 |

OTHER PUBLICATIONS

"Uniaxial Anisotropy in FeNiCuMnCoSiP Amorphous Alloy Ribbon", University of Science and Technology of China, Acta Metallurgica Sinica (China) 27, (2), B91–B95, Apr. 1991 ISSN: 0412-1961, Abstract.

"Magnitization Process in High Permeability Fe--Cu-Nb-Si-B Alloys", Bang, Lu; Shen, Q. Y.; Matsumoto, N.; Ono, F.; Kohmoto, O.; Maeta, H.; Haruna, K., Journal of Magnetism and Magnetic Materials v 104–07 pt 1 Feb. 2, 1992, pp. 147–148, 1992, Abstract.

"Magnetic Phase Transitions in FeNiBSi Alloys", Reisser, R.; Faehnle, M.; Kronmueller, H., Journal of Magnetism and Magnetic Materials v 97 n 1–3, Jun. 2, 1991, pp. 83–101, Abstract.

"Rotational Spin-Glass Properties of Amorphous (Fe sub 1-x Mn sub x) sub 75 P sub 16 B sub 6 Al sub 3", Goeckner, H. P.; Kouvel, J. S., Journal of Applied Physics 70, (10–II), 6089–6091, Nov. 15, 1991, ISSN: 0021-8979, Abstract.

(List continued on next page.)

Primary Examiner—Bruce A. Reynolds
Assistant Examiner—Tu Hoang
Attorney, Agent, or Firm—Gary L. Griswold; Carolyn A. Bates; Peter Forrest

[57] ABSTRACT

An electromagnetic radiation susceptor material comprises at least one species of particle dispersed in a dielectric binder material. Any dispersed species of particle comprises a ferromagnetic amorphous alloy having the composition $F_{100-y-x}M_yTM_x$, where M is one or more magnetic elements selected from the group consisting of Fe, Co, and Ni; M is one or more metalloids selected from the group consisting of B, C, Al, Si, P and Ge; TM is one or more transition metal selected from the group consisting of columns IIIB (including the rare earths) to VIIB of the periodic table, and especially Ti, V, Cr, Mn, Zr, Nb, and Ta; $0 \leq x \leq 20$; and $10 \leq y \leq 30$. The transition metal controls the Curie temperature of the alloy to provide temperature self-regulation. Many types dielectric binder are suitable. The susceptor material may be applied to substrate, such as an electrically conductive material.

12 Claims, No Drawings

U.S. PATENT DOCUMENTS

"Activation Energy Distribution in Amorphouse Fe–Cr–P–C Alloy, Determined for T//c Measurements During Structural Relaxation", Bourrous, M.; Varret, F., Solid State Communications v 57 n 8, Feb. 1986, pp. 713–716, 1986, Abstract.

"Field Induced Transition in the Amorphous Ferromagnet Co//7//0//.//4Fe//4//.//6Si//1//5B//1//0", Montarroyos, E.; de Almeida, J. R. L.; Machado, F. L. A.; Rezende, S. M., Journal of Magnetism and Magnetic Materials v 104–07 pt 1, Feb. 2, 1992, pp. 149–151, Abstract.

"Influence of Crystallization on the Optical Properties of amorphouse Alloy Fe//5Co//7//0Si//1//5B//1//0", Knyazev, Yu. V.; Barakovskikh, A. B.; Bolotin, G. A.; Potapov, A. P., Physics of Metals and Metallography (English translation of Fizika Metallov i Metallovedenie) v 59 n 6 1985, pp. 95–99, 1985, Abstract.

"Low Temperature Behavior of the Magnetic Permeability Aftereffect in Amorphous Ferromagnetic Alloys", Allia, P.; Vinai, F.; Turtelli, R. S., IEEE Transactions on Magnetics v MAG-23 n 5 Sep. 1987, Intermag '87: Int Magn Conf, Tokyo, Jpn, Apr 14–17, 1987 pp. 2542–2544, 1987, Abstract.

"Hydrogen Mobility in the amorphous Alloy Fe//4//0Ni//4//0P//1//4B//6 as Studied by Induced Magnetic Anisotropy Measurements", Chambron, W.; Lancon, F.; Chamberod, A., CEN de Grenoble, Grenoble, Fr, 1986, Abstract.

"Paramagnetic Neutron Scattering from an Amorphous Fe//8//0Cr//5B//1//5 Alloy", Dobrzynski, L., Boni, P.; Chen, M. E., Journal of Magnetism and Magnetic Materials v 68 n 2 Aug. 2, 1987 pp. 221–227, 1987, Abstract.

"Fractal Analysis of Magnetic After–effects in the Amorphous Alloy Fe//4//0Ni//4//0P//1//4B//6 at 500 K", Rivas, J.; Lopez–Quintela, M. A.; Walz, F.; Kronmueller, H., Physica Status Solidi (A) Applied Research v 111 n 2 Feb. 1989 pp. 611–616, 1989, Abstract.

"Kinetics of the Magnetically Induced Anisotropy in Amorphous Ferromagnetic Co//7//1Fe//1Mo//1Mn//4Si//1//4B//9", Reininger, T.; Moser, N.; Hofmann, A.; Kronmueller, H., Physica Status Solidi (A) Applied Research v 111 n 1 Jan. 1989 pp. 243–255, 1989, Abstract.

"Domain Wall Stabilization in Co//7//4Fe//6B//2//0 Amorphous Alloys", Horvat, J.; Babic, E.; Marohnic, Z.; Liebermann, H. H., Philosophical Magazine B: Physics of Condensed Matter; Electronic, Optical and Magnetic Properties v 63 n 6 Jun. 1991 pp. 1235–1245, 1991, Abstract.

"Magnetic Properties of Amorphous (Fe//1// minus//xNi//x)//7//5Si//1//0B//1//5 Alloys", Kim, Kyeong–Sup; Lee, Joo–Il; Yu, Seong–Cho; Kim, Yark–Yeon; Lim, Woo–Young, Structural Materials: Properties, Mictostructure and Processing Materials Science & Engineering A: Structural Materials: Properties Microstructure and Processing v A133 pt 1 Mar. 15, 1991. pp. 216–219, 1991, Abstract.

"AC Susceptibility of AS-Quenced and Laser Annealed Metallic Glasses", Ferreirinho, J.; Lee, S. J.; Campbell, S. J.; Calka, A, Journal of Magnetism and Magnetic Materials v 88 n 3 Aug. 1990 pp. 281–286, 1990, Abstract.

ELECTROMAGNETIC RADIATION SUSCEPTOR MATERIAL EMPLOYING FERROMAGNETIC AMORPHOUS ALLOY PARTICLES

TECHNICAL FIELD

This invention relates to electromagnetic radiation susceptor materials which comprise particles dispersed in dielectric binders.

BACKGROUND

Electromagnetic radiation susceptor materials typically comprise one or more kinds of particles dispersed through a dielectric binder material. Incident radiation (typically in the GHz region of the spectrum) is converted into heat that is re-radiated by the susceptor to the surrounding environment. In this respect, susceptor materials differ from shielding materials, which reflect incident radiation with essentially no heating, and from absorbing materials, which attempt to completely frustrate the incident radiation by destructive interference.

SUMMARY OF INVENTION

The invention is an electromagnetic radiation susceptor material, comprising at least one type of ferromagnetic amorphous alloy particle and a dielectric binder through which the particle(s) is (are) dispersed. Any of the dispersed particles comprises a ferromagnetic amorphous alloy having the composition $F_{100-y-x}M_yTM_x$, where F is one or more magnetic element(s) selected from the group consisting of Fe, Co, and Ni; M is one or more metalloid(s) selected from the group consisting of B, C, Al, Si, P, Ge and As; TM is one or more transition metal(s) selected from columns IIIB (including the rare earths) to VIIB of the periodic table, especially Ti, V, Cr, Mn, Zr, Nb, and Ta; $0 \leq x \leq 20$; and $10 \leq y \leq 30$.

The transition metal component controls the Curie temperature of the alloy, and thus the magnetic response of the particles, providing self-regulation of temperature surrounding the susceptor material.

DETAILED DESCRIPTION

The susceptor material of the invention comprises at least one species of ferromagnetic amorphous particle dispersed in a dielectric binder material. Typical volume loading factors range from one to 50 percent.

Any of the dispersed species of particles comprises ferromagnetic alloys having the composition $F_{100-y-x}M_yTM_x$, where F is one or more magnetic elements selected from the group consisting of Fe, Co, and Ni; M is one or more metalloids selected from the group consisting of B, C, Al, Si, P, Ge and As; TM is one or more transition metal(s) selected from columns IIIB (including the rare earths) to VIIB of the periodic table, especially Ti, V, Cr, Mn, Zr, Nb, and Ta; $0 \leq x \leq 20$; and $10 \leq y \leq 30$.

The transition metal component controls the Curie temperature of the alloy, typically permitting a choice of Curie temperature in the range of 50° to 400° C. The Curie temperature determines the temperature at which the magnetic susceptability of the ferromagnetic amorphous alloy particles goes to zero, thus ending the interaction with the incident electromagnetic radiation. This allows the susceptor to regulate temperature in a region adjacent the material as a function of time. This feature of the material is known as "self-regulation." Of course, the Curie temperature should be chosen to be less than any temperature at which the properties of the dielectric binder change unacceptably, such as the melting point of the binder, or any temperature affecting the curing of polymeric components that may be present in the binder.

The ferromagnetic amorphous alloys may be prepared by techniques involving rapid quenching, such as melt-spinning of a master alloy produced in an induction furnace. The preferred alloys contain at least 50% amorphous phase. Thermal annealing below the crystallization temperature improves the permeability, and thus the performance, of the alloys. Thirty minutes is a typical annealing time.

The ferromagnetic amorphous alloys are extremely resistant to oxidation and corrosion. However, while the alloys may be reduced to smaller particles in any convenient manner, such as by grinding in an attritor or other high energy grinder, the preferred method uses a chromate treatment to prevent oxidation, as taught in European Patent Application 87307965.1. Other suitable methods include atomization, such as ultrasonic gas atomization or rotating disk atomization.

The particle size should be smaller than a fraction of the incident electromagnetic wavelength, but greater than several times the electromagnetic wave penetration depth (skin depth), which is also dependent upon incident radiation wavelength. For radiation in the range of 1-100 GHz (i.e., wavelengths on the order of centimeters), where penetration depths are typically on the order of ten to one-hundred micron, the typical particle size is 0.1 to 300 micron.

Dispersion of the particles into the dielectric binder can be done by any convenient process, with mixing or extrusion being the most typical.

The dielectric binder may be made from a ceramic, polymeric, or elastomeric material. Ceramic binders are preferred for applications requiring exposure to high temperatures, while polymeric binders are preferred for their flexibility and lightness. Many polymeric binders are suitable, including polyethylenes, polypropylenes, polymethylmethacrylates, urethanes, cellulose acetates, epoxies, and polytetrafluoroethylene (PTFE). Suitable elastomeric binders are natural rubbers and synthetic rubbers, such as the polychloroprene rubbers known by the tradename "NEOPRENE" and those based on ethylene propylene diene monomers (EPDM). Other preferred binders are silicone compounds available from General Electric Company under the designations RTV-11 and RTV-615. Also, paper can serve as a suitable dielectric binder.

The dielectric binder could be a made from thermosetting or thermoplastic material. Thermosetting materials, once heated, irreversibly cure and cannot be remelted non-destructively to be reformed. Thermoplastic materials can be repeatedly heated and reformed. In either case, the materials may be heated and set into a form by one or more forces external to the binder. Typically the force is due to heat conduction, or pressure, but it may be the influence of gravity or a vacuum. In this respect the binders suitable for the present invention differ from the "conformable" absorber materials taught in Whitney et al. U.S. Pat. No. 4,814,546, which require molecular forces internal to the binder (such as a mechanical stress in a stretchable material) to be responsible for the change in shape of the absorber.

Many types of adhesives have the required thermoplastic or thermosetting properties. An adhesive is a material which forms intimate contact with a surface such that mechanical force can be transferred across the contact interface. Suitable thermoplastic and thermosetting adhesives include (but are not limited to) polyamides, polyethylenes, polypropylenes, polymethylmethacrylates, urethanes, cellulose acetates, vinyl acetates, epoxies, and silicones.

Alternatively, the conformable materials mentioned above are also suitable for other embodiments of the invention. For example, a thermoplastic heat-shrinkable binder may be formed from cross-linked or oriented crystallizable materials such as polyethylene, polypropylene, and polyvinyl chloride; or from amorphous materials such as silicones, polyacrylates, and polystyrenes. Solvent-shrinkable or mechanically stretchable binders may be elastomers such as natural rubbers or synthetic rubbers such as reactive diene polymers; suitable solvents are aromatic and aliphatic hydrocarbons. Specific examples of such materials are taught in Whitney et al. U.S. Pat. No. 4,814,546.

The binder may be homogenous, or a matrix of interentangled fibrils, such as the PTFE matrix taught in Ree et al. U.S. Pat. No. 4,153,661. In general, a susceptor in this embodiment is formed in a fibrillation process involving the formation of a water-logged paste of doubly layered particles and PTFE particles, intensive mixing at about 50° to about 100° C., biaxial calendering at about 50° to about 100° C., and drying at about 20° to about 100° C. The composite of PTFE fibrils and particles has the high tensile strength of the PTFE matrix.

The invention is suitable for use in as broad an incident frequency range as possible in the radio frequency range (KHz to MHz) and the microwave region of approximately 2 to 40 GHz.

To be effective in the microwave spectrum, the susceptor material should have a thickness in the direction of radiation propagation greater than about one-fortieth (2.5 percent) of the incident wavelength. The 2–40 GHz range implies a thickness greater than the order of about 0.2 mm. Thicker layers generally provide improved performance, but the increased weight and reduced flexibility are not desired in many applications. Thus, while layers having thicknesses up to one-fourth (25 percent) of the incident wavelength are possible, they are not preferred. For example, in the same frequency region this upper thickness limit is on the order of about 37.5 mm, but sufficient absorption can be obtained with layers on the order of 2.0 mm or less in thickness.

The susceptor material is non-electrically conductive, i.e., it has a high DC resistivity. If the resistivity is too low, the susceptor effectively becomes a conductive sheet, which reflects radiation instead of absorbing it. The resistivity of elemental iron, for example, is about $10^{-5}$ ohm-cm at room temperature. The resistivity of the ferromagnetic amorphous alloys used in this invention is not significantly higher, on the order of $1.5 \times 10^{-4}$ ohm-cm. Insulators typically have resistivities of $10^{12}$ ohm-cm or more. However, the susceptor materials of the invention show measured resistivities greater than $10^8$ ohm-cm at room temperature, indicating that they are non-conductive.

The susceptor material may be bound to any substrate, but especially to an electrically conductive material, by extruding the susceptor material onto the substrate and allowing the susceptor material to cure. Many thermoplastic binders are suitable for extrusion, especially polyvinylchlorides, polyamides, and polyurethanes. The substrate may be a wire or cable in lieu of a flat sheet. Alternatives to extrusion include the use of adhesives, and processes involving in-place thermal casting.

Furthermore, a laminated structure, each lamina individually constructed according to the description above, is possible. For example, one lamina may be an susceptor comprising one species of ferromagnetic amorphous particle, a second lamina may be a susceptor material comprising a second species, and a third lamina may be a susceptor material comprising yet a third species. Two to five layers are used in preferred embodiments. The total thickness of the laminated structure may be as great as 40 centimeters, although generally each lamina will meet the thickness limitations described above. Use of a laminated structure allows the absorption profile of the composite structure to be "tuned" to a particular frequency range and bandwidth of interest.

The invention need not be in the form of a flat sheet. For a cylindrical conductor, for example, a pre-sized flexible cylindrical shell susceptor material is preferred to minimize possible stretching, cracking, or delamination of a flat laminated sheet. The pre-formed cylindrical shell could be slit along its length, wrapped around the conductor (or slid along the long axis of the conductor) with little distortion, and then adhered into place. The seam formed by the edges of the slit should be sealed.

EXAMPLE I

Ferromagnetic amorphous alloys were manufactured in ribbon form with the composition $Fe_{73}B_{10}Si_5P_2Cr_{10}$. They were tested for suitability for the invention by inductive heating, using a 10 kW RF power supply (frequency 200–450 kHz) at three different power settings, 20%, 30% and 40%. At 20% power, the ribbon rapidly heated from room temperature (23° C.) to about 45° C. in 5 seconds, to about 53° C. in 10 seconds, and to about 57° C. in 15 seconds. However, after 25 seconds, the temperature was only about 60° C. At 30% power, the ribbon rapidly heated from room temperature to about 50° C. in 5 seconds, to about 57° C. in 10 seconds. However, after 15 seconds, the temperature was only about 60° C., and it increased only gradually to about 63° C. in 35 seconds. At 40% power, the ribbon heated at generally the same rate as at 30% power.

The rapid heating followed by a constant temperature versus time profile indicates excellent temperature self-regulation of the ferromagnetic amorphous alloy.

EXAMPLE II

Two susceptor materials were constructed using RTV 615 silicon dielectric binders. Each susceptor material comprised ferromagnetic amorphous alloy particles of 325 mesh (44 micron) size manufactured as described above; one had the composition $Fe_{72}P_{13}B_7Cr_8$, the other had the composition $Co_{67}B_{15}Si_9Mn_6Nb_3$. The Curie temperatures of the particles were 190° C. and 235° C. respectively. The volume loading percentage in the RTV 615 binder was 20% for each susceptor material.

A block of each material was heated in a common microwave oven. The iron-based alloy susceptor material showed rapid heating from room temperature to about 80° C. in 50 seconds, and to about 125° C. in 100 seconds; after that, to about 140° C. in 150 seconds, and to about 150° C. in 200 seconds; followed by slowly increasing heating to about 180° C. after 550 seconds.

The cobalt-based alloy susceptor material also showed rapid heating, to about 80° C. after 50 seconds, and to about 140° C. after 100 seconds; after that, slowly increasing heating to about 175° C. at 225 seconds, and to about 200° C. at 400 seconds.

EXAMPLE III

A susceptor material comprising a ferromagnetic amorphous alloy particles of 325 mesh (44 micron size) having a composition of $Fe_{72}P_{13}B_7Cr_8$ dispersed into RTV 615 dielectric binder at a volume loading of 20% was subjected to standard microwave reflection and absorption measurements. The calculated imaginary part of the permeability as a function of frequency over the 0–10 GHz range agreed well with the theoretical model of absorption due to the gyromagnetic mechanism.

EXAMPLE IV

Ferromagnetic amorphous alloy particles having the composition $Fe_{76.5}P_{12}B_6Cr_{5.5}$ were produced by grinding an amorphous ribbon of the same composition to a powder of less than 325 mesh (44 micron) size. The particles had magnetization above 10 kG and Curie temperature of 215° C. The particles were dispersed in a PTFE membrane according to the process described above, at a particle loading of 20 volume percent. Three samples were made by calendering the membrane to thicknesses of 0.254 mm, 0.508 mm, and 0.559 mm. Microwave block heating tests showed rapid heating to about 120°–160° C. (depending on thickness) after 40 seconds, followed by constant heating at about 135–160° C. in the 60–180 second period.

EXAMPLE V

Ferromagnetic amorphous alloy particles of less than 200 mesh (70 micron) were dispersed into RTV 11 binder at a particle loading of 5 volume percent. Sample 1 had a composition of $Fe_{76.5}P_{12}B_6Cr_{5.5}$ and a Curie temperature of about 215° C.; Sample 2 had a composition of $Fe_{74}P_{12}B_8Cr_6$ and a Curie temperature of about 190° C.; and Sample 3 had a composition of $Fe_{76}B_9P_6Si_3Cr_6$ and a Curie temperature of about 210° C. Block heating by RF induction (360 watts at 5–8 MHz) of Sample 1 showed rapid heating from room temperature to about 200° C. in 10 seconds, and to about 225° C. in 20 seconds, followed by constant heating at about 230° C. from 30–90 seconds. Sample 2 showed rapid heating from room temperature to about 170° C. in 10 seconds, and to about 180° C. in 20 seconds, followed by slowly increasing heating to about 200° C. at 55 seconds. Sample 3 showed rapid heating to about 180° C. at 10 seconds, and to about 200° C. at 20 seconds, followed by constant heating at about 200° C. until 90 seconds.

These rapid heating rates, about 50° C. per second, compare favorably to those of prior art materials at five volume percent loading in RTV 11. For example, susceptors comprising stainless steel and mica particles heated at a rate of slightly less than 60° C. per second, while those comprising nickel particles did so at about 55° C. per second. Less suitable were susceptors comprising magnetite, at about 20° C. per second; iron, about 15° C. per second; stainless steel coated microbubbles at about 15° C. per second; nickel-zinc ferrites at slightly less than 15° C. per second; PM 3161 alloy at about 10° C. per second; and carbonyl iron at about 2° C. per second.

However, another sample of the invention comprising 40 micron particles at the same volume percentage showed a heating rate of about 90° C. per second.

I claim:

1. An electromagnetic radiation susceptor material, comprising at least one of a species of particles dispersed in a dielectric binder material, in which at least one of the species of particles comprises a ferromagnetic amorphous alloy having a composition $F_{100-y-x}M_yTM_x$, where F is at least one of any magnetic element selected from a first group consisting of Fe, Co, and Ni; M is at least one of any metalloid selected from a second group consisting of B, C, Al, Si, P, Ge and As; TM is at least one of any transition metal selected from columns IIIB to VIIB of the periodic table; $0<x<20$; and $10<y<30$.

2. The susceptor material of claim 1 in which TM is at least one of transition metals selected from a third group consisting of Ti, V, Cr, Mn, Zr, Nb, and Ta.

3. The susceptor material of claim 1 in which the dielectric binder is ceramic.

4. The susceptor material of claim 1 in which the dielectric binder is polymeric.

5. The susceptor material of claim 4 in which the polymeric binder comprises a polymer chosen from a fourth group consisting of polyethylenes, polypropylenes, polymethylmethacrylates, urethanes, cellulose acetates, and polytetrafluoroethylene.

6. The susceptor material of claim 4 in which the polymeric binder comprises a polymer chosen from a fifth group consisting of thermosetting polymeric adhesives and thermoplastic polymeric adhesives.

7. The susceptor material of claim 4 in which the polymeric binder comprises a polymer chosen from a sixth group consisting of heat-shrinkable polymers, solvent-shrinkable polymers, and mechanically-stretchable polymers.

8. The susceptor material of claim 1 in which the dielectric binder is elastomeric.

9. The susceptor material of claim 1 in which said at least one of the species of particles is dispersed in the dielectric binder at a volume loading between one and fifty percent.

10. The susceptor material of claim 1 in which the susceptor material is bounded to a substrate.

11. The susceptor material of claim 10 in which the susceptor material is bounded as bound to an electrically conductive substrate.

12. A laminated construction comprising at least two laminae of an electromagnetic radiation susceptor material, each lamina comprising at least one of a species of particles dispersed in a dielectric binder material, in which at least one of the species of particles comprises a ferromagnetic amorphous alloy having a composition $F_{100-y-x}M_yTM_x$, where F is at least one of any magnetic element selected from a first group consisting of Fe, Co, and Ni; M is at least one metalloid selected from a group consisting of B, C, Al, Si, P, Ge and As; TM is at least one of any transition metal selected from columns IIIB to VIIB of the periodic table; $0 \leq x \leq 20$; and $10 \leq y \leq 30$.

* * * * *